United States Patent [19]

Bateman et al.

[11] Patent Number: 4,920,311
[45] Date of Patent: Apr. 24, 1990

[54] USER SELECTION OF METER BALLISTICS

[76] Inventors: Robert Bateman, 12365 Madrona Way, Nevada City, Calif.; Donald R. Christensen, 10134 Ladybird Dr., Grass Valley, Calif.

[21] Appl. No.: 263,486

[22] Filed: Oct. 27, 1988

[51] Int. Cl.⁵ .................. G01R 19/16; G01H 3/14
[52] U.S. Cl. ................... 324/125; 324/103 P; 73/647; 340/754
[58] Field of Search .............. 324/103 P, 102, 125, 324/140 R, 115; 381/56, 58; 73/647; 340/753, 754, 815.01

[56] References Cited

U.S. PATENT DOCUMENTS

| | | | |
|---|---|---|---|
| 3,991,628 | 11/1976 | Narita | 73/647 |
| 4,061,042 | 12/1977 | Hetrich | 324/103 P |
| 4,166,245 | 8/1979 | Roberts | 324/103 P |
| 4,528,501 | 7/1985 | Dorrough et al. | 324/103 |
| 4,679,042 | 7/1987 | Trethewey | 340/754 |
| 4,686,459 | 8/1987 | Begas | 381/58 |
| 4,706,289 | 11/1987 | Jensen | 324/103 P |

Primary Examiner—Reinhard J. Eisenzopf
Assistant Examiner—Vinh P. Nguyen
Attorney, Agent, or Firm—Francis I. Gray

[57] ABSTRACT

User selection of meter ballistics is accomplished by separating the meter display from the meter drive circuitry. An input signal is input in parallel into appropriate level determining circuits, with the outputs being selected for processing by a microprocessor. The microprocessor processes the selected outputs according to a ballistic standard selected by an operator to generate a display signal. For LED displays the display signal has a bar component that illuminates all the LEDs up to the maximum level of the displayed output and a dot signal that illuminates only one or a very few LEDs around the maximum level of the displayed output.

11 Claims, 2 Drawing Sheets

USER SELECTION OF METER BALLISTICS

BACKGROUND OF THE INVENTION

The present invention relates to level meters, and more particularly to a user selection of meter ballistics that separates a display device from its control circuitry so that different circuitry may be coupled to the display device for different applications.

Many audio devices, such as mixers, tape recorders and amplifiers have level meters to help an operator monitor a signal being passed. Several types of meters have been implemented to cover different applications, operator preferences, etc. Audio consoles designed for radio application typically come equipped with VU meters that indicate average signal levels, but that also have an attack overshoot to help emphasize peak content. Consoles designed for live audio reinforcement may have PPM type meters that give a much more accurate indication of peak material. In both cases, however, there may be a need to have both types of responses available.

Traditionally meters have been implemented as electro-mechanical devices with fixed ballistics, such as attack, decay, overshoot, etc., and frequency response, although electrical networks in the meter drive circuitry may be able alter to some degree these parameters. The general goal of altering the natural response of an electro-mechanical meter is to obtain a more accurate indication of the peak content of the signal. Since the overall meter response is highly dependent on the mechanical characteristics of the meter, ballistics are relatively difficult to control over a wide range.

Recently level meters have been implemented with display devices like LEDs or fluorescent tubes. Examples of these types of devices are disclosed in U.S. Pat. No. 4,528,501 issued July 9, 1985 to Michael L. Dorrough and Kenneth S. Gold entitled "Dual Loudness Meter and Method" and in U.S. Pat. No. 4,679,042 issued July 7, 1987 to Paul M. Trethewey entitled "Bar/Dot Level Meter". Since these devices have no mechanical inertia, all ballistics are generated by the meter drive circuitry. The drive circuitry may be a simple linear amplifier, or it may implement a ballistics standard such as VU or PPM or both. There is generally no choice of ballistics, so in situations where operator preferences or the type of work being done varies a compromise must be made.

What is desired is a level meter that provides an operator with a choice of meter ballistics so that the operator can select for display an appropriate ballistics standard for the work being done.

SUMMARY OF THE INVENTION

Accordingly the present invention provides a user selection of meter ballistics that allows selection of different metering circuitry for display according to the desired application. An input signal is rectified and applied in parallel to both a peak detect circuit and an averaging circuit. The resulting voltage levels are converted into dB and digitized for processing by a microprocessor. The parameters of the peak detect circuit and the averaging circuit are also controlled by the microprocessor. The processed outputs are converted into display commands that are converted into analog and demultiplexed for display on an LED display in the form of a bar and/or a dot.

The objects, advantages and novel features of the present invention are apparent from the following detailed description when read in conjunction with the appended claims and attached drawing.

DESCRIPTION OF THE PREFERRED EMBODIMENT

Figure 1:
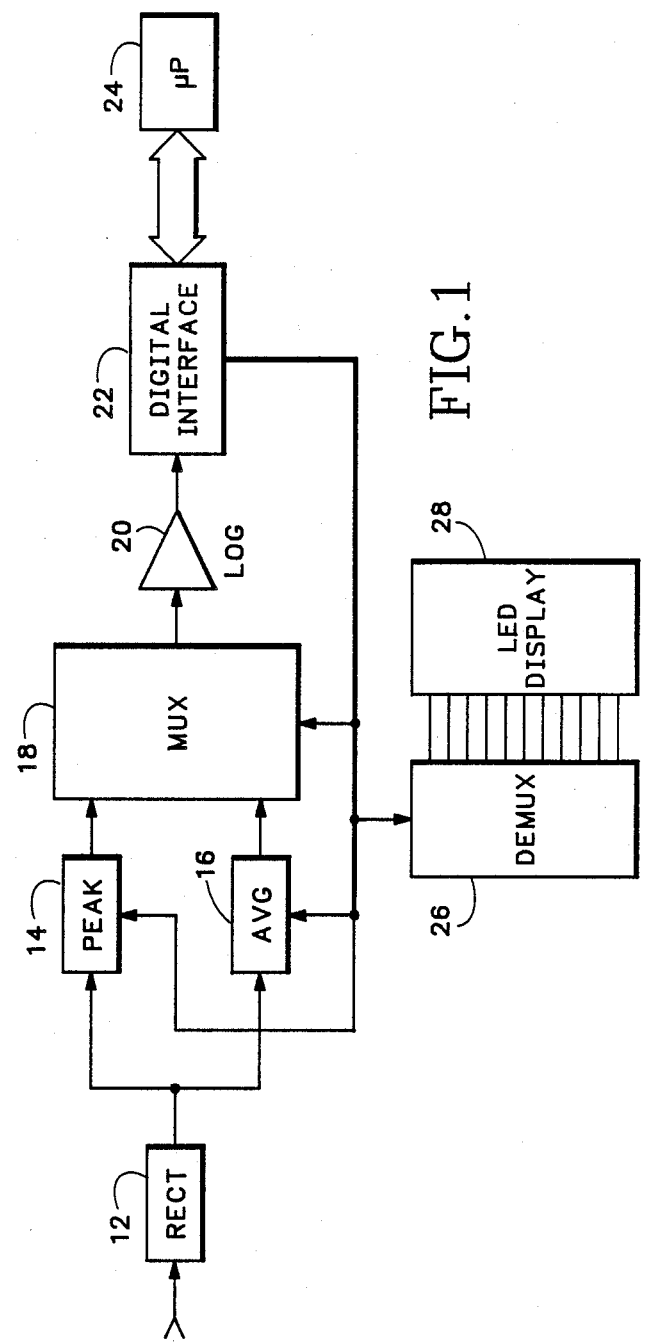
FIG. 1 is a block diagram of a level meter according to the present invention.

Referring now to FIG. 1 a signal is input to a rectifier circuit 12 to convert the signal to a varying d.c. signal. The varying d.c. signal is then input in parallel to a peak detect circuit 14 and an averaging circuit 16, the outputs of which are input to a multiplexer 18. The output of the multiplexer 18 is input to a logarithmic amplifier 20 for conversion from voltage levels to dB values. The dB values are input to a digital interface 22 that converts the dB values to digital values for processing by a microprocessor 24. The processing results are passed back through the digital interface 22 where they are converted into analog values. The analog values are input to a demultiplexer 26 to drive an LED display device 28 that has a plurality of LED devices disposed as a bar/dot level meter.

Figure 2:
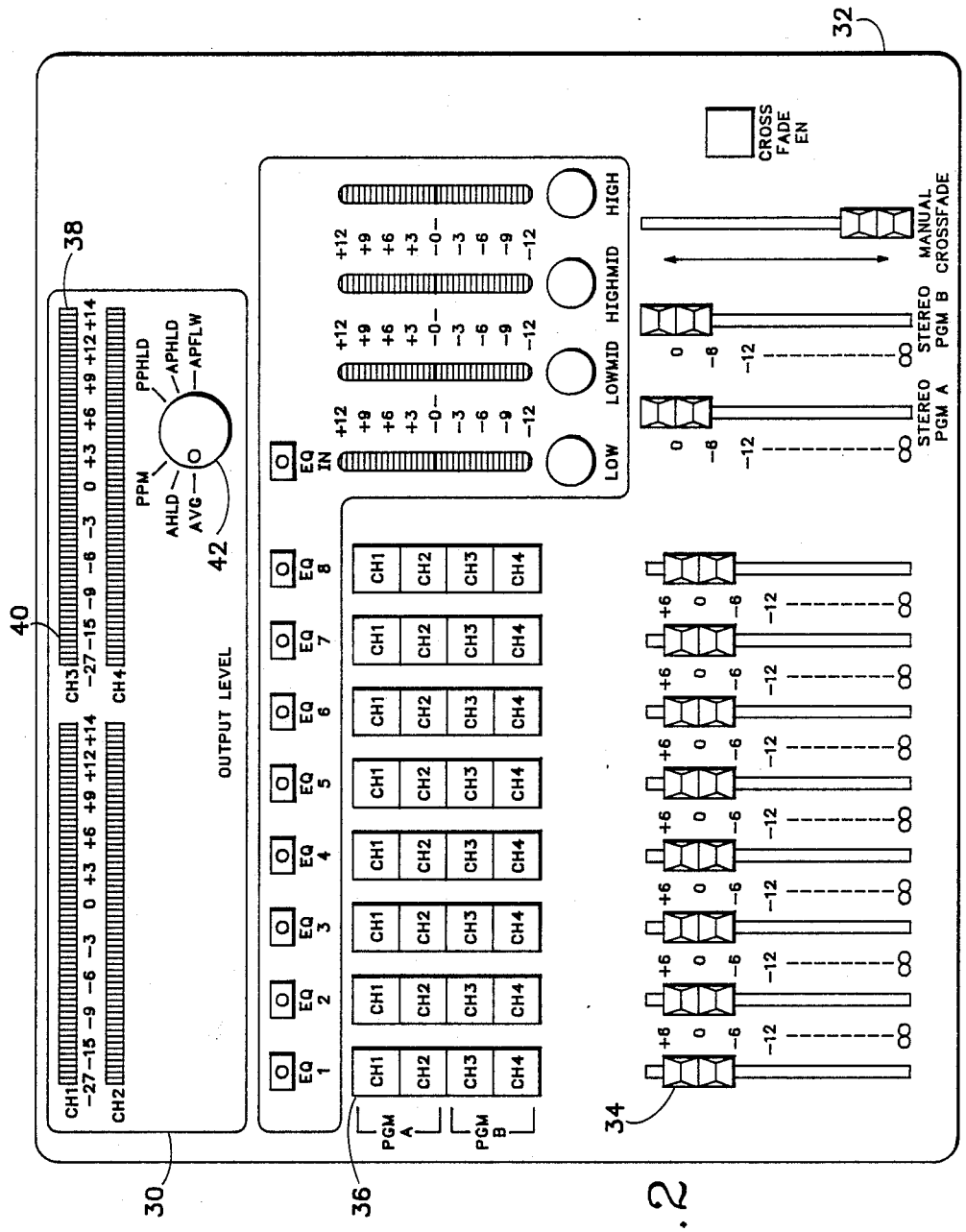
FIG. 2 is a plan view of a control panel having an LED display for the level meter according to the present invention.

As shown in FIG. 2 a level meter 30 may be incorporated into a control panel 32 where multiple electrical signal input sources are controlled by appropriate slide controls 34 and cross-connected to one or more of four output channels by appropriate push-buttons 36. Each output channel has its own display 38 as part of the level meter 30, with each display having a plurality of segments or LED devices 40. Also included is a knob 42 for selecting a desired meter ballistic standard for the displays 38. The knob also could be implemented in any other appropriate means, such as being a Dip Switch. Also means may be provided for setting different ones of the displays 38 to different ballistic standards.

One set of ballistic standards may be AVeraGe (VU), Average with average HoLD, quasi PPM, Peak with Peak HoLD, Average with Peak HoLD and Average with Peak FoLloW. The Average ballistic standard provides a bar type output of the displays 38 that represents the average level of the signal. The Average with average HoLD ballistic standard provides a bar type output that represents the average level of the signal and a dot hold type output representing the peak of the average level. The quasi PPM ballistic standard differs from the true PPM in that the decay and attach are at the same rate rather than having a fast attack followed by a slow decay as specified in appropriate standard specifications, and provides a moving bar type output. The Peak with Peak HoLD ballistic standard provides a moving bar type output for the peak level with a dot type output held for the peak of the peak levels. The Average with Peak HoLD ballistic standard is very common and provides a bar type output for the average level and a dot type output held for the peak level. Finally the Average with Peak FoLlow ballistic standard provides a bar type output for the average level and a moving dot type output for the peak level of the signal.

The microprocessor 24, according to the type of ballistic standard selected, sets the parameters for the peak detect and averaging circuits 14, 16 as well as controlling the multiplexer 18 to pass the required peak and/or average signal on for processing. The peak and/or average signals are converted into either a bar type signal that causes all the LEDs below the maximum level to light or a dot type signal that causes only the one or two LEDs at the maximum level to light. These signals are then applied to the LED display 28 via the demultiplexer 26 to provide the appropriate display according to the selected meter ballistic. The control of the peak detect and averaging circuits 14, 16 may either be in the form of switching in and out appropriate resistances and capacitances to affect the peak and averaging parameters, such as averaging time constants and amounts of peak and decay, or may actually switch in and out different hardware circuits having different parameters.

Alternatively the peak detect and averaging circuits 14, 16 may be simulated with software equivalents in the microprocessor 24, with the input signal being directly sampled by the A/D converter of the digital interface 22. Then the entire meter ballistics would exist in the microprocessor 24 as software algorithms, giving an operator extreme flexibility in designing any standard or custom meter ballistics desired.

Thus the present invention provides a user selection of meter ballistics that separates the display from the driving circuitry by separately processing the outputs of the driving circuitry according to a selected ballistic standard and providing the processed results to the display.

What is claimed is:

1. An apparatus for user selection of meter ballistics comprising:
   means for providing a plurality of meter ballistic standards;
   means for selecting a meter ballistic standard from said plurality of meter ballistic standards;
   means for converting an input signal into a processed signal according to the meter ballistic standard selected from the plurality of meter ballistic standards;
   means for processing the processed signal according to the selected meter ballistic standard to produce a display signal; and
   means for displaying the display signal to represent the input signal as a function of the selected meter ballistic standard.

2. An apparatus as recited in claim 1 wherein the converting means comprises:
   means for translating the input signal into a plurality of level signals according to the selected meter ballistic standard;
   means for combining the level signals to produce the processed signal.

3. An apparatus as recited in claim 2 wherein the translating means comprises:
   means for converting the input signal to a varying d.c. signal; and
   means for averaging the varying d.c. signal according to parameters determined by the selected meter ballistic standard to produce one of the level signals.

4. An apparatus as recited in claim 3 wherein the translating means further comprises means for obtaining a peak signal from the varying d.c. signal according to parameters determined by the selected meter ballistic standard, the peak signal being another one of the level signals.

5. An apparatus as recited in claim 2 wherein the combining means comprises a multiplexer for selecting one of the level signals as the processed signal according to a control signal determined by the selected meter ballistic standard.

6. An apparatus as recited in claim 2 wherein the input signal converting means further comprises means for translating the processed signal from one value convention to another value convention prior to input to the processing means.

7. An apparatus as recited in claim 6 wherein the processed signal translating means comprises a logarithmic amplifier for converting the processed signal from voltage levels to decibel levels.

8. An apparatus as recited in claim 1 wherein the processing means comprises:
   means for converting the processed signal into a digital signal; and
   means for computing the display signal from the digital signal from the converting means according to the selected meter ballistic standard.

9. An apparatus as recited in claim 1 wherein the displaying means comprises a plurality of LED devices disposed adjacent each other, the ones of the LED devices that illuminate being a function of the display signal, the display signal including a bar signal that illuminates all adjacent LED devices up to the LED device representing a maximum level value of the bar signal and a dot signal that illuminates a specified number of adjacent LED devices representing a maximum level value of the dot signal.

10. An apparatus as recited in claim 9 wherein the displaying means further comprises means for converting the display signal from a digital display signal to an analog display signal for controlling the plurality of LED devices.

11. A method of displaying level characteristics of an input signal comprising the steps of:
   providing a plurality of meter ballistic standards;
   selecting a meter ballistic standard from said plurality of meter ballistic standards;
   converting the input signal into a digital signal;
   processing the digital signal according to the meter ballistic standard selected from the plurality of meter ballistic standards to produce a display signal; and
   displaying the display signal to represent the level characteristics of the input signal as a function of the selected meter ballistic standard.

* * * * *